United States Patent
Stanimirov et al.

(10) Patent No.: US 6,713,998 B2
(45) Date of Patent: Mar. 30, 2004

(54) METHOD FOR MEASURING THE RESISTANCE AND THE INDUCTANCE OF A LINE

(75) Inventors: Michael Stanimirov, Baden (CH); Bernhard Deck, Weilheim (DE); Walter Rueegg, Endingen (CH)

(73) Assignee: ABB Research Ltd, Zurich (CH)

( * ) Notice: Subject to any disclaimer, the term of this patent is extended or adjusted under 35 U.S.C. 154(b) by 20 days.

(21) Appl. No.: 09/984,990

(22) Filed: Nov. 1, 2001

(65) Prior Publication Data

US 2002/0158641 A1 Oct. 31, 2002

(30) Foreign Application Priority Data

Nov. 6, 2000 (EP) ............................................. 00811038

(51) Int. Cl.[7] ................................................. C01R 1/14
(52) U.S. Cl. .................................. 324/117 R; 324/127
(58) Field of Search ............................. 324/117 R, 656, 324/691, 772, 127; 340/664; 361/154; 702/65, 68

(56) References Cited

U.S. PATENT DOCUMENTS 6,397,156 B1 * 5/2002 Bachmann et al. ........... 702/65
6,437,554 B1 * 8/2002 Atwater et al. ......... 324/117 R
6,437,555 B1 * 8/2002 Pioch et al. ................. 324/127

FOREIGN PATENT DOCUMENTS

DE    216547 A1    12/1984
DE    4204515 A1   8/1993

OTHER PUBLICATIONS

"Rogowski coils suit relay protection and measurement" by Ljubomir Kojovic, IEEE Computer Applications in Power, Jul. 1997.*

* cited by examiner

*Primary Examiner*—N. Le
*Assistant Examiner*—Walter Benson
(74) *Attorney, Agent, or Firm*—Burns, Doane, Swecker & Mathis, L.L.P.

(57) ABSTRACT

The method described here makes it possible to determine the impedance of a line (1) by measuring the voltage (u) applied across the line and the time derivative of the current (i) flowing through the line. The measured values of the differentiated current are not integrated in this case, but rather are substituted directly, together with the measured voltage values, into an equation system from which the values of the inductance (L) and the resistance (R) of the line (1) can be estimated. In this way, integration of the values of the differentiated current is obviated.

10 Claims, 1 Drawing Sheet

METHOD FOR MEASURING THE RESISTANCE AND THE INDUCTANCE OF A LINE

FIELD OF THE INVENTION

The invention relates to a method for measuring the resistance and the inductance of a line. Such methods are used e.g. for short circuit detection in electricity supply lines.

BACKGROUND OF THE INVENTION

In order to measure the impedance and, in particular, the resistance and the inductance of a line, the current flowing in it and the voltage applied across it are generally measured in a time-resolved fashion and converted into the required values by computation. For the measurement of currents, especially in the case of electrical power lines, use has also recently been made of a Rogowski coil, i.e. a coil that extends around the line carrying the current and measures the derivative of the current with respect to time. In order to find the current, this derivative needs to be integrated with respect to time. This necessitates additional numerical calculation and can lead to inaccuracies (clipping effects, phase offset).

SUMMARY OF THE INVENTION

It is therefore an object of the invention to provide a method of the type mentioned in the introduction, which gives a maximally accurate and simple way of measuring the inductance and the resistance.

Instead of integrating the values from the Rogowski coil, the measured values are hence substituted directly into an equation system that delivers the desired results.

Preferably, a sizeable number of measurements are used, so that the equation system is over-determined. The resistance and the inductance can then be found by adjustment computation. The method of least squares is preferably employed, which can be done by means of simple matrix inversion or recursively.

BRIEF DESCRIPTION OF THE DRAWING

Further configurations, advantages and applications of the invention are contained in the following description with reference to FIG. 1. The FIGURE shows an equivalent circuit diagram of a line to be measured.

Figure 1:
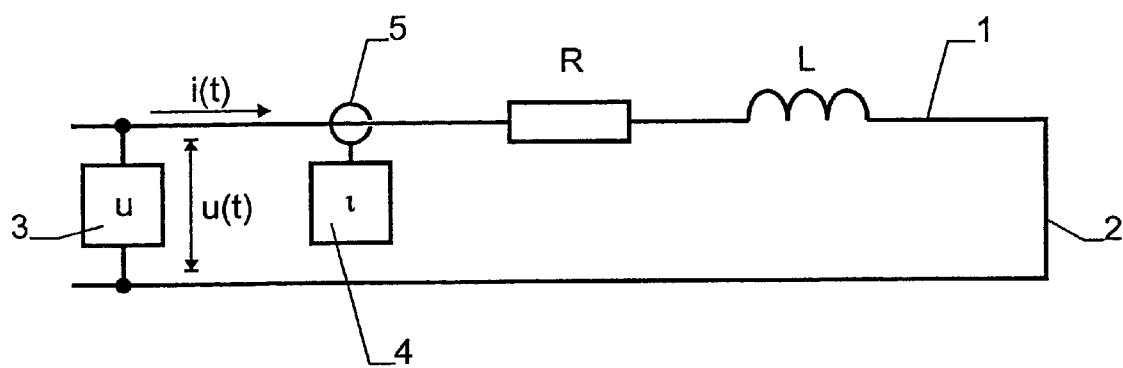
FIG. 1 shows the equivalent circuit diagram of a line 1 with a resistance R and inductance L. It may, for example, be an electrical power line that is short-circuited at a point 2.

In order to measure the voltage u(t) across the line 1, a voltmeter 3 is provided. It may, for example, be an electro-optical voltage transformer that is capable of reproducing the value of the voltage u(t) directly (possibly to within a known calibration constant). In order to measure the current i(t) in the line 1, a current differential meter 4 is used. This comprises a Rogowski coil 5, which produces a voltage proportional to the time derivative $\partial/\partial t$ of i(t). Accordingly, the current differential meter 4 produces measurements that correspond (to within a known calibration constant) to the value $\partial i(t)/\partial t$.

The meters 3, 4 are operated at a sampling rate $f_A = 1/T_A$ and deliver a series of voltage values $u_0, u_1, \ldots$ and a series of values $\iota_0, \iota_1, \ldots \iota_N$ of the differentiated current, with $u_k = u(kT_A)$ and $\iota_k = \partial i / \partial t|t=kT_A$. The resistance R and the inductance L are to be determined from these values.

For the voltage u(t), the following applies:

$$u(t) = R \cdot i(t) + L \cdot \frac{\partial}{\partial t} i(t) \tag{1}$$

Using the Rogowski coil, the time derivative of the current i(t) is measured, i.e. the quantity $$\iota(t) = \frac{\partial}{\partial t} i(t) \tag{2}$$

The current i(t) can be calculated by integrating (2). Substitution into (1) hence leads to:

$$u(t) = R \cdot \int \iota(\tau) d\tau + L \cdot \iota(t) \tag{3}$$

Equation (3) can be converted into a discretized form. Preferably, the Laplace transform u(p) is formed, and a bilinear transformation $p = A \cdot (z-1)/(z+1)$, where A takes the value $A \approx 2/T_A$ in the case of the Tustin (bilinear) approximation. A can more accurately be described as $$A = \omega_0 \cdot \cot\left(\frac{\omega_0}{2} \cdot \frac{T_A}{2}\right), \tag{3a}$$

where $\omega_0$ is the frequency at which the digital approximation is to agree with the analog values. When formula (3a) is used instead of $A=2/T_A$, the approximation by the digital model agrees accurately with the analog model at the angular frequency $\omega_0$. In practice, $w_0 = 2\pi f_N$ is selected, where $f_N$ is the mains frequency of the voltage along the line to be surveyed.

Discretization of Equation (3) approximately leads to:

$$u_n = u_{n-1} + \alpha_0 \cdot \iota_n + \alpha_1 \cdot \iota_{n-1} \tag{4}$$

where $u_n$ and $u_{n-1}$ are two successively sampled voltage values and $\iota_n$ and $\iota_{n-1}$ are two successively sampled values of the differentiated current. The parameters $\alpha_0$ and $\alpha_1$ are given by $$\alpha_0 = \frac{R}{A} + L \tag{5}$$

$$\alpha_1 = \frac{R}{A} - L$$

Equation (4) provides a basis for finding the required values R and L, or the parameters $\alpha_0$ and $\alpha_1$. To that end, N measurements of the voltage $\{u_1, u_2, \ldots u_N\}$ and of the differentiated current $\{\iota_1, \iota_2, \ldots \iota_N\}$, with $N \geq 3$, are needed in order to set up, from (4), an equation system with N−1 equations for $a_0$ and $a_1$, so that the parameters can be calculated. This procedure has the advantage that direct integration of Equation (3) can be circumvented.

From the parameters $\alpha_0$ and $\alpha_1$, the resistance R and the inductance L can then be determined from $$R = A \cdot \frac{(\alpha_0 + \alpha_1)}{2} \tag{6}$$

$$L = \frac{\alpha_0 - \alpha_1}{2}$$

Preferably, N>3, i.e. more than two equations are set up, so that over-determination of the equation system is obtained. The parameter values can, in this case, be determined with high accuracy by means of adjustment computation.

For example, the parameters $\alpha_0$ and $\alpha_1$, can be determined by applying the method of least squares to the linear equations (4) for n=1 . . . N, which in vector notation leads to the following solution:

$$\Theta = \begin{pmatrix} \alpha_0 \\ \alpha_1 \end{pmatrix} = \left[\sum_{n=1}^{N} m_n m_n^T\right]^{-1} \cdot \sum_{n=1}^{N} m_n y_n \quad (7)$$

with $$m_n = \begin{pmatrix} i_n \\ i_{n-1} \end{pmatrix}$$

and $y_n = (u_n - u_{n-1})$

In this, the first multiplicand on the right-hand side of Equation (7) is the inverse of a 2×2 matrix produced from the values $\iota_k$ of the differentiated current, while the second multiplicand is a sum of vectors comprising the values $\iota_k$ of the differentiated current weighted with differences between consecutive voltage values $u_k$.

The equation system (4) can also be solved by means of recursive parameter estimation methods or Kalman filters. An iterative method may, e.g. for each vector pair $m_n$, $y_n$, calculate a new approximation $\Theta_n$ for the parameter vector $\Theta$ from the preceding approximation $\Theta_{n-1}$, by means of the recursion formula $$K = P_{n-1} \cdot m_n \cdot (\lambda + m_n^T \cdot P_{n-1} \cdot m_n)^{-1}$$

$$\Theta_n = \Theta_{n-1} + K \cdot (y_n - m_n^T \cdot \Theta_{n-1})$$

$$P_n = (E - K \cdot m_n^T) \frac{P_{n-1}}{\lambda} \quad (8)$$

In this, E is the unit matrix, $\lambda$ is a weighting factor between 0.8 and 0.9 and $P_n$ is the so-called precision matrix (start value e.g. $10^3 \cdot E$ or $10^5 \cdot E$). K is referred to as a correction factor.

List of references
  1: line
  2: short circuit point
  3: voltmeter
  4: current differential meter
  5: Rogowski coil
  A: factor
  E: unit matrix
  $f_A$: sampling rate
  i(t): time-varying current
  K: correction factor
  L: inductance
  N: number of measurements within the observation window
  R: resistance
  $T_A$: time interval between measurements
  u(t): voltage
  $u_k$: voltage values
  $\iota(t)$: time-differentiated current
  $\iota_k$: values of the time-differentiated current
  $\alpha_0, \alpha_1$: parameter values
  $\lambda$: weighting factor
  $\Theta$: parameter vector

What is claimed is:

1. A method for measuring the resistance R and the inductance L of a line, in which a voltage u across the line and a time derivative $\iota$ of a current through i through the line are measured at a rate $1/T_A$ in order to obtain a series of N voltage values $u_0, u_1, \ldots u_N$ and a series of N values $\iota_0, \iota_1, \ldots \iota_N$ of the differentiated current, wherein the first derivative of the current $\iota$ of the current i is measured using a Rogowski coil, $N \geq 3$ and the voltage values and the values of the differentiated current are substituted directly into an equation system with N−1 equations of the form $$u_n = u_{n-1} + \alpha_0 \cdot \iota_n + \alpha_1 \cdot \iota_{n-1},$$

with parameters $$\alpha_0 = \frac{R}{A} + L$$

$$\alpha_1 = \frac{R}{A} - L$$

where
  $A \cong 2/T_A$
or $$A = \omega_0 \cdot \cot\left(\frac{\omega_0}{2} \cdot \frac{T_A}{2}\right),$$

and wherein the resistance R and the inductance L are found from the equation system.

2. The method as claimed in claim 1, wherein $N \geq 3$, and wherein the resistance R and the inductance L are found by adjustment computation.

3. The method as claimed in claim 2, wherein the resistance R and the inductance L are found by solving $$\begin{pmatrix} \alpha_0 \\ \alpha_1 \end{pmatrix} = \left[\sum_{n=1}^{N} m_n m_n^T\right]^{-1} \cdot \sum_{n=1}^{N} m_n y_n$$

with $$m_n = \begin{pmatrix} i_n \\ i_{n-1} \end{pmatrix}$$

and $y_n = (u_n - u_{n-1})$.

4. The method as claimed in claim 1, wherein the equation system is solved iteratively by calculating, for a plurality of n, an approximation $\Theta_n$ for $$\Theta = \begin{pmatrix} \alpha_0 \\ \alpha_1 \end{pmatrix}$$

from the recursion formula $$K = P_{n-1} \cdot m_n \cdot (\lambda + m_n^T \cdot P_{n-1} \cdot m_n)^{-1}$$

$$\Theta_n = \Theta_{n-1} + K \cdot (y_n - m_n^T \cdot \Theta_{n-1})$$

$$P_n = (E - K \cdot m_n^T) \frac{P_{n-1}}{\lambda}$$

$$m_n = \begin{pmatrix} i_n \\ i_{n-1} \end{pmatrix}$$

with
and $y_n = (u_n - u_{n-1})$
where E is the unit matrix, $\lambda$ is a weighting factor, in particular between 0.8 and 0.9, and $P_n$ is a matrix with a start value, preferably, between $10^3$ E and $10^5$ E.

5. The method as claimed in claim 1, wherein $A=2/T_A$.

6. The method as claimed in claim 1, wherein $$A = \omega_0 \cdot \cot\left(\frac{\omega_0}{2} \cdot \frac{T_A}{2}\right),$$

where $\omega_0$ is the angular frequency of a voltage along the line.

7. The use of the method as claimed in claim 1 for measuring the impedance of an electrical power line.

8. The use of the method as claimed in claim 7, wherein the method is used for short circuit detection in electricity supply lines.

9. The method of claim 1, wherein the equation system is obtained through discretization of an equation $u(t)=R\cdot\int\iota(\tau)d\tau+L\cdot i(t)$ wherein t and $\iota$ are time variables.

10. The method as claimed in claim 9, wherein the discretization is done by forming the Laplace transform $u(p)$ using a bilinear transform $p=A(z-1)/(z+1)$.

* * * * *